US009286821B2

(12) United States Patent
Wu et al.

(10) Patent No.: US 9,286,821 B2
(45) Date of Patent: Mar. 15, 2016

(54) DISPLAY DRIVING CIRCUIT AND DRIVING METHOD THEREOF, DISPLAY APPARATUS

(71) Applicants: BOE TECHNOLOGY GROUP CO., LTD., Beijing (CN); BEIJING BOE DISPLAY TECHNOLOGY CO., LTD., Beijing (CN)

(72) Inventors: Xingji Wu, Beijing (CN); Seung Min Lee, Beijing (CN); Yizhen Xu, Beijing (CN); Liang Zhang, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/368,144

(22) PCT Filed: May 20, 2013

(86) PCT No.: PCT/CN2013/075915
§ 371 (c)(1),
(2) Date: Jun. 23, 2014

(87) PCT Pub. No.: WO2014/153821
PCT Pub. Date: Oct. 2, 2014

(65) Prior Publication Data
US 2015/0154901 A1 Jun. 4, 2015

(30) Foreign Application Priority Data
Mar. 26, 2013 (CN) .......................... 2013 1 0100375

(51) Int. Cl.
G09G 3/20 (2006.01)
G11C 19/28 (2006.01)

(52) U.S. Cl.
CPC .......... *G09G 3/20* (2013.01); *G11C 19/28* (2013.01); *G09G 2310/0213* (2013.01); *G09G 2310/0286* (2013.01); *G09G 2320/0209* (2013.01); *G09G 2320/0247* (2013.01)

(58) Field of Classification Search
CPC ... G09G 3/3674; G09G 5/18; G09G 2310/0267
See application file for complete search history.

(56) References Cited

U.S. PATENT DOCUMENTS 6,593,918 B2 * 7/2003 Taguchi ................. G09G 3/361
345/204
8,044,915 B2 * 10/2011 Honda ................. G09G 3/3677
345/87

(Continued)

FOREIGN PATENT DOCUMENTS

CN 102033367 A 4/2011
CN 102136252 A 7/2011

(Continued)

OTHER PUBLICATIONS

First Chinese Office Action Appln. No. 201310100375.0; Dated Dec. 26, 2014.

(Continued)

*Primary Examiner* — Kent Chang
*Assistant Examiner* — William Lu
(74) *Attorney, Agent, or Firm* — Ladas & Parry LLP

(57) ABSTRACT

The present disclosure relates to the display technique. Disclosed is a display driving circuit, including: a gate line driving circuit, configured to separate gate line driving signals of adjacent rows according to a first output enable signal; a shielding signal generation circuit, configured to trigger and generate a shielding signal when the gate line driving signal needs to be turned off; and a gate line shielding circuit configured to shield the first output enable signal according to the shielding signal so as to turn off the gate line driving signal, wherein the first output enable signal is inputted from a first inputting terminal of the gate line shielding circuit, the shielding signal is inputted from a second inputting terminal of the gate line shielding circuit, and an outputting terminal of the gate line shielding circuit is connected to the gate line driving circuit. The display driving circuit, a driving method thereof and a display apparatus according to the embodiments of the present disclosure are capable of shielding the first output enable signal directly according to the shielding signal so as to turn off the gate line driving signal and shield the data on the corresponding gate lines, thereby they can avoid occurring of abnormal statuses with the first output enable signal and also can save the cost and space of the circuit.

6 Claims, 3 Drawing Sheets

(56) References Cited

U.S. PATENT DOCUMENTS

| | | | |
|---|---|---|---|
| 9,087,493 B2* | 7/2015 | Jung | G09G 3/3688 |
| 9,097,950 B2* | 8/2015 | Zhao | G02F 1/136286 |
| 2003/0006979 A1* | 1/2003 | Tsuchi et al. | 345/204 |
| 2003/0038771 A1* | 2/2003 | Sunohara | 345/103 |
| 2004/0100435 A1* | 5/2004 | Baek | G09G 3/3677 345/98 |
| 2006/0082534 A1 | 4/2006 | Honda et al. | |
| 2008/0030494 A1* | 2/2008 | Woo et al. | 345/212 |
| 2008/0250175 A1* | 10/2008 | Sheafor et al. | 710/100 |
| 2009/0079715 A1* | 3/2009 | Kim | 345/204 |
| 2010/0177081 A1* | 7/2010 | Lee et al. | 345/211 |
| 2011/0102395 A1* | 5/2011 | Cheng et al. | 345/208 |
| 2011/0141003 A1* | 6/2011 | Kim et al. | 345/102 |
| 2011/0181625 A1* | 7/2011 | Shin et al. | 345/690 |
| 2011/0254831 A1 | 10/2011 | Chang et al. | |
| 2011/0298727 A1* | 12/2011 | Yousefpor et al. | 345/173 |
| 2012/0105405 A1* | 5/2012 | Hsiao et al. | 345/208 |
| 2012/0162291 A1 | 6/2012 | Kim et al. | |

FOREIGN PATENT DOCUMENTS

| | | |
|---|---|---|
| CN | 102436798 A | 5/2012 |
| CN | 102737590 A | 10/2012 |
| KR | 20060043380 A | 5/2006 |
| KR | 20070077379 A | 7/2007 |
| KR | 20070099145 A | 10/2007 |
| KR | 20110079038 A | 7/2011 |

OTHER PUBLICATIONS

Written Opinion of the International Searching Authority dated Dec. 26, 2013; PCT/CN2013/075915.

Patent Certificate of the Chinese priority application dated May 13, 2015.

Korean Office Action dated Mar. 31, 2015; Appln. No. 10-2014-7019388.

Korean Notice of Allowance dated Oct. 29, 2015; Appln. No. 10-2014-7019388.

* cited by examiner

… (1)

DISPLAY DRIVING CIRCUIT AND DRIVING METHOD THEREOF, DISPLAY APPARATUS

TECHNICAL FIELD

The present disclosure relates to the field of display technique, and more particularly, to a display driving circuit and a driving method thereof, and a display apparatus.

BACKGROUND

A display apparatus drives a panel to operate by a timing controller outputting a special driving signal, and generally the timing controller outputs following signals: a frame start signal (STV), a gate line clock signal (CPV), a first output enable signal (OE1), a gate line voltage beveled signal (OE2), a data read and output signal (TP), a pixel polarity control signal (POL) and a data enable signal (DE). Wherein the signals STV, CPV, OE1 and OE2 control and drive gate lines on an array substrate of the display apparatus cooperatively; wherein a rising edge of the signal CPV triggers and drives the respective gate lines, and gate line driving signals for the respective gate lines are triggered sequentially by shift registers; and the signal OE1 is used for insulating the gate line driving signals for adjacent rows so as to avoid a crosstalk.

FIG. 1 is a schematic diagram illustrating a display driving circuit as known. As illustrated in FIG. 1, in the display driving circuit as known, the gate line driving circuit triggers the gate line driving signal according to the gate line clock signal, separates the gate line driving signals for the adjacent rows according to the first output enable signal, and then outputs the separated gate line driving signal to the gate lines. FIG. 2 is a schematic diagram of a relationship between the first output enable signal and the gate line driving signal as known. As illustrated in FIG. 2, at a rising edge of the gate line clock signal CPV, a corresponding gate line driving signal is triggered to be at a high level; and at a rising edge of the first output enable signal OE1, the corresponding gate line driving signal is pulled down to a low level, the gate line driving signal, for example, a signal Gate1 or a signal Gate2 is turned off. It can be seen that, in a high level region of the first output enable signal OE1, the gate line driving signals for the adjacent rows are at the low level and shielded, so a plurality of intervals among the gate line driving signals are formed, and the corresponding gates are forced to be turned off during the interval regions, so that a crosstalk phenomenon between the adjacent gates as being driven are avoided.

However, disadvantages of the existing techniques consist in that the gate line driving signal cannot be shielded with the first output enable signal according to specified situations, for example, frame data resulting in a flicker phenomenon in a frame needs to be shielded in order to settle a flicker problem caused by a POL inversion in a image sticking elimination technique. The existing techniques may separate the gate line driving signals for the adjacent rows only according to the first output enable signal OE1, but cannot trigger and generate a shielding signal according to the specified situation, shield the first output enable signal according to the shielding signal and turn off the corresponding gate line driving signal, so that it cannot remove a data which might lead to an abnormal display.

SUMMARY

The present disclosure provides a display driving circuit, a driving method thereof and a display apparatus, in order to settle the problem that the existing techniques could not shield the first output enable signal according to the shielding signal and in turn could not remove the data which might lead to the abnormal display.

According to an aspect of the present disclosure, a display driving circuit is provided, comprising:

a gate line driving circuit, configured to separate gate line driving signals for adjacent rows according to a first output enable signal;

a shielding signal generation circuit, configured to trigger and generate a shielding signal when the gate line driving signal needs to be turned off; and a gate line shielding circuit, configured to shield the first output enable signal according to the shielding signal so as to turn off the gate line driving signal, wherein the first output enable signal is inputted from a first inputting terminal of the gate line shielding circuit, the shielding signal is inputted from a second inputting terminal of the gate line shielding circuit, and an outputting terminal of the gate line shielding circuit is connected to the gate line driving circuit.

Alternatively, in the display driving circuit according to embodiments of the present disclosure, the gate line shielding circuit comprises a first transistor, a second transistor, a first resistor, a second resistor and a third resistor, wherein, a gate of the first transistor functions as the first inputting terminal to receive the first output enable signal, a source of the first transistor is connected with a power supply and a drain of the first transistor is connected with one terminal of the first resistor;

a gate of the second transistor functions as the second inputting terminal to receive the shielding signal, a source of the second transistor is connected with the power supply and a drain of the second transistor is connected with one terminal of the third resistor and functions as the outputting terminal;

the other terminal of the first resistor is connected with one terminal of the second resistor and the other terminal of the third resistor; and the other terminal of the second resistor is grounded.

Alternatively, in the display driving circuit according to the embodiments of the present disclosure, the shielding signal is triggered and generated by a timing controller.

According to another aspect of the present disclosure, there is provided a display apparatus comprising the display driving circuit according to the present disclosure.

According to a further aspect of the present disclosure, there is provided a driving method for driving the display driving circuit according to the present disclosure, comprising insulating the gate line driving signals for the adjacent rows according to the first output enable signal, and further comprising:

triggering and generating, by the shielding signal generation circuit, the shielding signal when the gate line driving signal needs to be turned off; and shielding the first output enable signal when the gate line shielding circuit detects the shielding signal, in order to turn off the gate line driving signal.

Alternatively, in the driving method according to the embodiments of the present disclosure, the first output enable signal is pulled up to a high level when a voltage of the shielding signal is in the high level.

The present disclosure provides a display driving circuit, a driving method thereof and a display apparatus, which are capable of shielding the first output enable signal directly according to the shielding signal so as to turn off the gate line driving signal and shield the data on the respective gate lines, therefore they can avoid occurring of abnormal statuses with the first output enable signal and also can save a cost and space of the circuit, and they have a simple structure and are easy to be realized.

DETAILED DESCRIPTION

In order to understand the present disclosure well, the present disclosure would be described in connection with drawings and detailed implementations below.

First Embodiment

Figure 1:
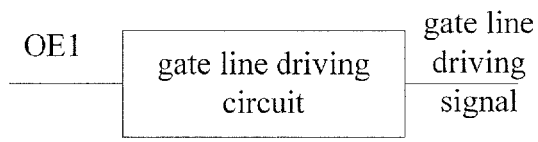
FIG. 1 is a schematic diagram illustrating a display driving circuit as known.
Figure 2:
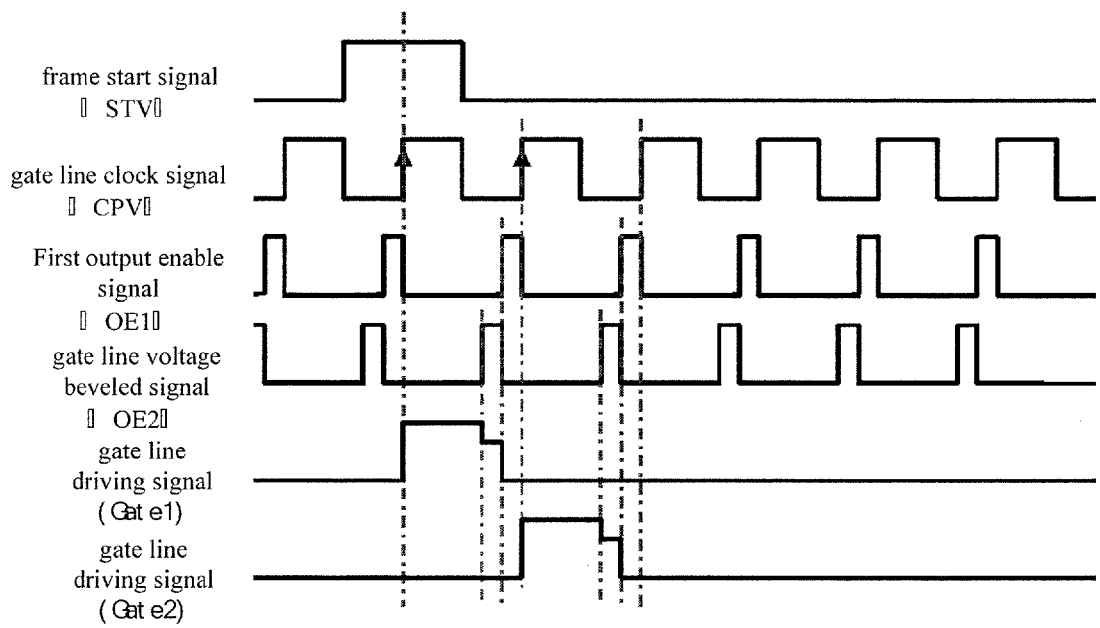
FIG. 2 is a schematic diagram illustrating a relationship between a first output enable signal and a gate line driving signal as known.
Figure 3:
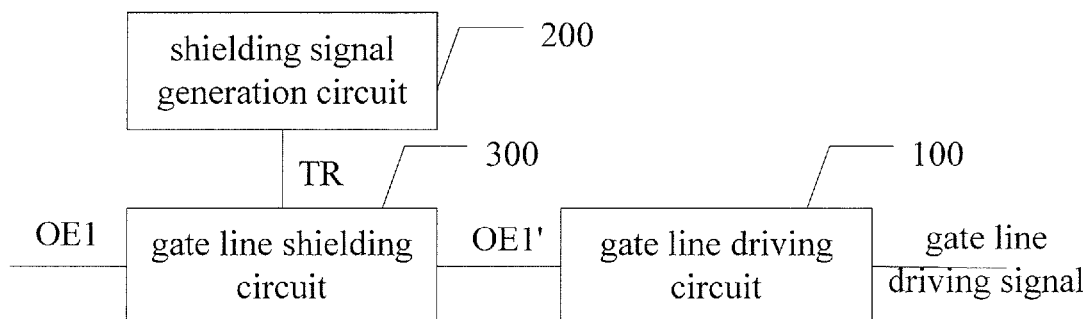
FIG. 3 is a circuit diagram of a display driving circuit according to embodiments of the present disclosure.

FIG. 3 is a circuit diagram of a display driving circuit according to the embodiments of the present disclosure, and as illustrated in FIG. 3, the display driving circuit according to the embodiments of the present disclosure comprises a gate line driving circuit 100, configured to separate gate line driving signals of adjacent rows according to a first output enable signal OE1;

further comprises:

a shielding signal generation circuit 200, configured to trigger and generate a shielding signal TR when the gate line driving signal needs to be turned off; and a gate line shielding circuit 300, at a first inputting terminal thereof, the first output enable signal OE1 is inputted, at a second inputting terminal thereof, the shielding signal TR is inputted, and to an outputting terminal thereof, the gate line driving circuit 100 is connected. The gate line shielding circuit 300 is configured to shield the first output enable signal OE1 according to the shielding signal TR so as to turn off the gate line driving signal.

By inputting the first output enable signal OE1 to the gate line shielding circuit 300, a signal OE1' outputted from the outputting terminal of the gate line shielding circuit 300 has a same waveform as that of the first output enable signal OE1 when the shielding signal TR is not triggered and generated, that is, the shielding signal TR is at a low level. That is to say, the signal OE1' outputted from the outputting terminal of the gate line shielding circuit 300 follows the first output enable signal OE1, the gate line shielding circuit 300 does not affect the first output enable signal OE1, which operates normally and is inputted to the gate line driving circuit 100, and the gate line driving circuit 100 separates and outputs the gate line driving signal so as to control a corresponding gate to operate normally.

When the shielding signal TR is triggered and generated, that is, the shielding signal TR is at a high level, the signal OE1' outputted from the outputting terminal of the gate line shielding circuit 300 remains the high level and shields the first output enable signal OE1. During the duration of the shielding signal TR, all the first output enable signals OE1 are shielded and in turn the gate line driving signals are shielded, so that all of the gates stops being driven.

Through the display driving circuit according to the embodiments of the present disclosure, the gate line driving signal is shielded by the first output enable signal according to the shielding signal directly, and the corresponding gate line is controlled to be turned off, which can save the cost and space of the circuit and can have a simple structure to be realized easily. The shielding signal generation circuit 200 can detect an abnormal signal depending on specific requirements, for example, regarding a flicker problem caused by a POL inversion, frame data resulting in the flicker, which are brought at the time of the POL inversion, may be found by the timing controller, the shielding signal can be triggered and generated, and then the first output enable signal is controlled according to the shielding signal so as to turn off the corresponding gate line driving signals, so that the frame data resulting in the abnormal display can be removed. Also, detection may be performed on the gate line driving signals for specified rows in one frame to find and remove specified rows of data resulting in abnormal signals.

Figure 4:
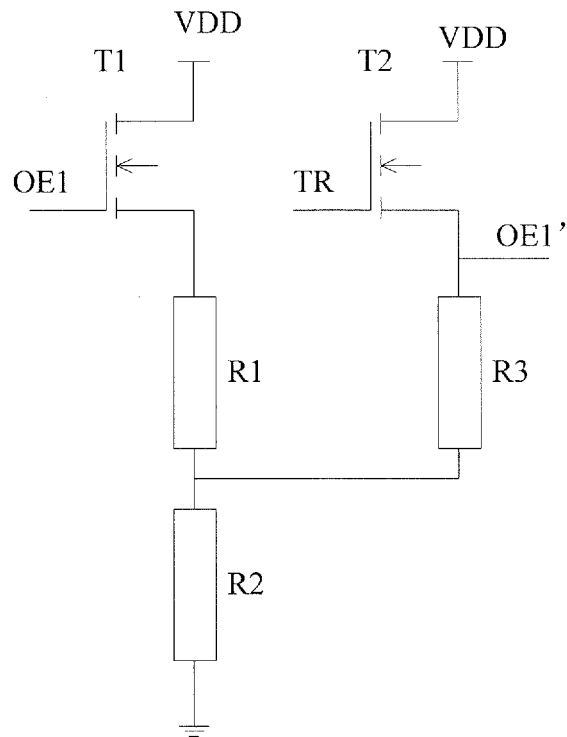
FIG. 4 is a circuit diagram of a gate line shielding circuit according to the embodiments of the present disclosure.

Alternatively, in the display driving circuit according to the embodiments of the present disclosure, a circuit diagram of the gate line shielding circuit according to the embodiments of the present disclosure is shown in FIG. 4. As illustrated in FIG. 4, the gate line shielding circuit 300 comprises a first transistor T1, a second transistor T2, a first resistor R1, a second resistor R2 and a third resistor R3, herein, a gate of the first transistor T1 functions as the first inputting terminal to receive the first output enable signal OE1, a source of the first transistor T1 is connected with a power supply VDD and a drain of the first transistor T1 is connected with one terminal of the first resistor R1;

a gate of the second transistor T2 functions as the second inputting terminal to receive the shielding signal TR, a source of the second transistor T2 is connected with the power supply VDD and a drain of the second transistor T2 is connected with one terminal of the third resistor R3 and functions as the outputting terminal to output the signal OE1';

the other terminal of the first resistor R1 is connected with one terminal of the second resistor R2 and the other terminal of the third resistor R3; and the other terminal of the second resistor R2 is grounded.

In the above embodiment, there is no limitation on configurations of the resisters, for example, the first resistor may be equivalent to and formed by several resistors connected in series or in parallel. The above embodiment is only a preferred one among others.

The above circuit is a detailed implementation of the gate line shielding circuit according to the embodiments of the present disclosure, and its principle may be described as follows.

When the shielding signal TR is at the high level, the second transistor T2 is turned on, a voltage at the drain of the second transistor T2 is pulled up to a power supply voltage, the signal OE1' outputted from the outputting terminal of the gate line shielding circuit 300 is at the high level, all the first output enable signals OE1 are shielded and in turn the gate line driving signals are further shielded, and all of the gate lines stop being driven.

When the shielding signal TR is at the low level, the second transistor T2 is turned off, the first transistor T1 is turned on or off according to the first output enable signal OE1, so that the signal OE1' outputted from the outputting terminal of the gate line shielding circuit 300 has a same waveform as that of the first output enable signal OE1, and more particularly: when the first output enable signal OE1 is at the high level, the first transistor T1 is turned on, a voltage of the signal OE1' outputted from the outputting terminal is pulled up to the high level, so the gate line driving signals are shielded at this time and the gate line driving signals for the adjacent rows are separated; when the first output enable signal OE1 is at the low level, the first transistor T1 is turned off, the voltage of the signal OE1's outputted from the outputting terminal is pulled down to the ground voltage, namely the low level, so the gate line driving signal is not shielded at this time and drives the corresponding gate line. Because the first output enable signal OE1 is an electric signal with same intervals generated from a clock signal, the gate line driving signal at that time is shielded when the first output enable signal OE1 is at the high level, so that the gate line driving signal generates intervals corresponding to those of the first output enable signal, thus the gate line driving signals of the adjacent rows are separated and the crosstalk is avoided; the signal OE1' outputted from the gate line shielding circuit 300 operates normally according to the first output enable signal OE1, and controls the gate line driving circuit at its back end to operate normally.

Alternatively, in the display driving circuit according to the embodiments of the present disclosure, the shielding signal is triggered and generated by a timing controller.

In order to settle the flicker problem caused by the POL inversion in a image sticking elimination technique, the timing controller triggers and generates the shielding signal TR when the POL is inverted because the POL inversion is controlled by the timing controller, and the shielding signal TR turns off the gate line driving signals with the first output enable signal OE1, thus the frame data which might result in the flicker as the POL inversion can be removed.

Second Embodiment

The present disclosure also provides a display apparatus comprising the display driving circuit according to the present disclosure.

By applying the display driving circuit according to the present disclosure on an display apparatus, the gate line driving signal can be shielded with the first output enable signal and the gate line driving circuit, and accordingly the corresponding gate line can be controlled, so that the data which might result in the abnormal display can be removed. The display driving circuit has a simple structure and is easy to be disposed on the display apparatus.

Third Embodiment

Figure 5:
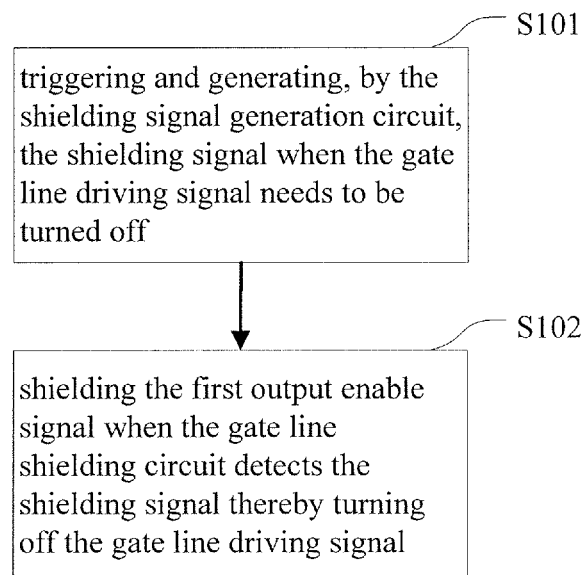
FIG. 5 is a flowchart of a driving method according to the embodiments of the present disclosure.

FIG. 5 is a flowchart of a driving method according to the embodiments of the present disclosure. As illustrated in FIG. 5, the driving method for driving the display driving circuit, such as the display driving circuit illustrated in the first embodiment of the present disclosure, according to the third embodiment of the present disclosure separates the gate line driving signals for the adjacent rows according to the first output enable signal, and further comprises processes as follows:

in a step S101, the shielding signal generation circuit triggers and generates the shielding signal when the gate line driving signal needs to be turned off; and in a step S102, the first output enable signal is shielded when the gate line shielding circuit detects the shielding signal thereby turning off the gate line driving signal.

Alternatively, in the driving method according to the embodiments of the present disclosure, the first output enable signal is pulled up to the high level when the voltage of the shielding signal is at the high level.

Figure 6:
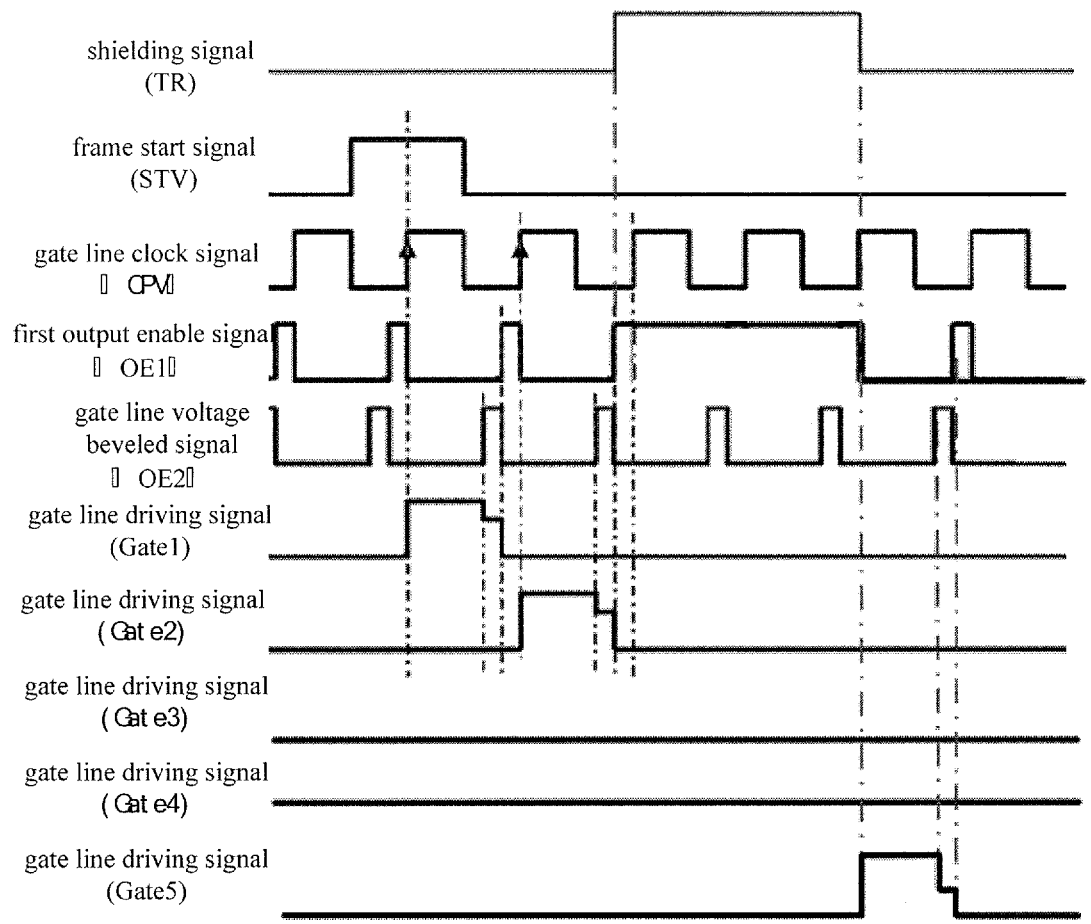
FIG. 6 shows signal waveform diagram for a shielding signal, the first output enable signal and the gate line driving signal according to the embodiments of the present disclosure.

FIG. 6 is signal waveform diagrams of the shielding signal, the first output enable signal and the gate line driving signal according to the embodiments of the present disclosure. As illustrated in FIG. 6, Gate1, Gate2, Gate3, Gate4 or Gate5 are the gate line driving signals respectively. When shielding signal is at the high level during turn-on intervals of the gate line driving signals Gate3 and Gate4, the first output enable signal is pulled up to the high level and is shielded, while the gate line driving signals Gate3 and Gate4 of the corresponding gate line driving circuits are set as the low level and shielded; when the shielding signal is at the low level, the first output enable signal resumes its normal output waveform and separates the gate line driving signals for the adjacent rows, and the respective gate line driving signals, such as the gate line driving signals Gate1, Gate2 or Gate5, of the gate line driving circuit also operate normally.

In the step S101 of the driving method according to the third embodiment of the present disclosure, the shielding signal generation circuit triggers and generates the shielding signal when the gate line driving signal needs to be turned off.

For example, in terms of the flicker problem in the frame caused by the POL inversion in the image sticking elimination technique, the frame data might be affected when the POL inversion is performed, which leads to occurring of the flicker in the frame; the frame data is transmitted through a plurality of rows of gate lines in the display apparatus; the data on the multiple corresponding rows of gate lines can be removed by means of turning off the gate line driving signals, so that the flickers in the frame can be avoided. Therefore the gate line driving signal needs to be turned off when the POL inversion is performed. The data which might result in the flickers in the frame can be removed by triggering and generating the shielding signal, shielding the first output enable signal, and turning off the corresponding gate line driving signal(s); otherwise, the shielding signal is not triggered, the first output enable signal is transmitted normally and the gate line driving signals operate normally. Herein the POL inversion is controlled by the timing controller, and thus the shielding signal TR can be triggered and generated by the timing controller depending on detailed situations of the POL inversion.

The above descriptions only illustrate the optional embodiments of the present disclosure, and of course the present disclosure can be embodied as other various embodiments. Any skilled pertaining to the art can make various modifications and variations based on the present disclosure without departing from the spirit and essence of the present disclosure, and such modifications and variations should be considered as falling into the scope sought for protection of the present disclosure, which is defined by the claims attached.

What is claimed is:

1. A display driving circuit, comprising:
    a gate line driving circuit, configured to separate gate line driving signals of adjacent rows according to a first output enable signal;
    a shielding signal generation circuit, configured to trigger and generate a shielding signal when the gate line driving signal needs to be turned off; and
    a gate line shielding circuit, configured to shield the first output enable signal according to the shielding signal so as to turn off the gate line driving signal,
    wherein the first output enable signal is inputted from a first inputting terminal of the gate line shielding circuit, the shielding signal is inputted from a second inputting terminal of the gate line shielding circuit, and an outputting terminal of the gate line shielding circuit is connected to the gate line driving circuit, wherein the gate line shielding circuit comprises a first transistor, a second transistor, a first resistor, a second resistor and a third resistor, wherein, a gate of the first transistor functions as the first inputting terminal to receive the first output enable signal, a source of the first transistor is connected with a power supply and a drain of the first transistor is connected with one terminal of the first resistor;

a gate of the second transistor functions as the second inputting terminal to receive the shielding signal, a source of the second transistor is connected with the power supply and a drain of the second transistor is connected with one terminal of the third resistor and functions as the outputting terminal;

the other terminal of the first resistor is connected with one terminal of the second resistor and the other terminal of the third resistor; and the other terminal of the second resistor is grounded.

2. The display driving circuit of claim 1, wherein the shielding signal is triggered and generated by a timing controller.

3. A display apparatus comprising the display driving circuit of claim 1.

4. A driving method for driving the display driving circuit of claim 1, comprising insulating the gate line driving signals of the adjacent rows according to the first output enable signal, and further comprising:

triggering and generating, by the shielding signal generation circuit, the shielding signal when the gate line driving signal needs to be turned off; and shielding the first output enable signal when the gate line shielding circuit detects the shielding signal thereby turning off the gate line driving signal.

5. The driving method of claim 4, wherein the first output enable signal is pulled up to a high level when a voltage of the shielding signal is at the high level.

6. The display apparatus of claim 3, wherein the shielding signal is triggered and generated by a timing controller.

* * * * *